United States Patent
Yen

(10) Patent No.: US 10,855,251 B2
(45) Date of Patent: Dec. 1, 2020

(54) UNRELEASED PLANE ACOUSTIC WAVE RESONATORS

(71) Applicant: Texas Instruments Incorporated, Dallas, TX (US)

(72) Inventor: Ting-Ta Yen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 668 days.

(21) Appl. No.: 15/671,996

(22) Filed: Aug. 8, 2017

(65) Prior Publication Data

US 2019/0052247 A1    Feb. 14, 2019

(51) Int. Cl.
| | |
|---|---|
| *H03H 9/25* | (2006.01) |
| *H01L 41/18* | (2006.01) |
| *H03H 9/05* | (2006.01) |
| *H03H 9/02* | (2006.01) |
| *H03H 9/17* | (2006.01) |

(52) U.S. Cl.
CPC .............. *H03H 9/25* (2013.01); *H01L 41/18* (2013.01); *H03H 9/02228* (2013.01); *H03H 9/0533* (2013.01); *H03H 9/0561* (2013.01); *H03H 9/175* (2013.01)

(58) Field of Classification Search
CPC ......... H03H 9/25; H03H 9/0561; H01L 41/18
USPC ........................................ 310/311–371, 800
See application file for complete search history.

(56) References Cited

U.S. PATENT DOCUMENTS

| | | | |
|---|---|---|---|
| 3,988,703 A * | 10/1976 | DeVries | H03H 9/02685 333/195 |
| 4,188,557 A | 2/1980 | Mattuschka | |
| 4,193,473 A | 3/1980 | Hartemann | |
| 4,985,655 A | 1/1991 | Jensik et al. | |
| 5,747,857 A * | 5/1998 | Eda | H01L 27/20 257/416 |
| 5,767,612 A | 6/1998 | Takeuchi et al. | |
| 6,049,158 A | 4/2000 | Takeuchi et al. | |
| 6,087,198 A | 7/2000 | Panasik | |
| 6,094,294 A | 7/2000 | Yokoyama et al. | |
| 6,548,942 B1 | 4/2003 | Panasik | |
| 6,842,088 B2 | 1/2005 | Yamakawa et al. | |
| 7,067,964 B1 | 6/2006 | Kosinski | |
| 7,418,772 B2 | 9/2008 | Nishiyama et al. | |
| 7,621,624 B2 | 11/2009 | Pan et al. | |
| 7,675,389 B2 | 3/2010 | Yamakawa et al. | |
| 7,714,684 B2 | 5/2010 | Ruby et al. | |
| 7,786,826 B2 | 8/2010 | Thalhammer et al. | |
| 7,812,502 B2 | 10/2010 | Zalalutdinov et al. | |
| 7,893,597 B2 | 2/2011 | Nishimura et al. | |
| 7,939,987 B1 | 5/2011 | Solal et al. | |

(Continued)

OTHER PUBLICATIONS

C.J. Wilson, "Vibration modes of AT-cut convex quartz resonators," J. Phys. D: Appl. Phys., vol. 7, 1974, 7 pages.

(Continued)

*Primary Examiner* — Thomas M Dougherty
(74) *Attorney, Agent, or Firm* — Michael A. Davis, Jr.; Charles A. Brill; Frank D. Cimino

(57) ABSTRACT

Unreleased plane acoustic wave (PAW) resonators are disclosed. An example unreleased PAW resonator includes a substrate, a first acoustic reflector disposed on the substrate, and a piezoelectric layer disposed on the first acoustic reflector, wherein the first acoustic reflector and the piezoelectric layer are unreleased from the substrate.

17 Claims, 1 Drawing Sheet

(56) References Cited

U.S. PATENT DOCUMENTS

| | | |
|---|---|---|
| 8,215,171 B1 | 7/2012 | Smith et al. |
| 8,456,257 B1 | 6/2013 | Fattinger |
| 8,941,286 B2 | 1/2015 | Ortiz et al. |
| 9,232,289 B2 | 1/2016 | Bahr et al. |
| 9,577,603 B2 | 2/2017 | Burak et al. |
| 9,663,346 B1 | 5/2017 | Bahr et al. |
| 9,673,376 B1 | 6/2017 | Krivokapic et al. |
| 9,876,483 B2 | 1/2018 | Ortiz et al. |
| 2004/0070313 A1 | 4/2004 | Furukawa et al. |
| 2005/0093656 A1 | 5/2005 | Larson, III et al. |
| 2006/0255696 A1 | 11/2006 | Sato |
| 2009/0295505 A1 | 12/2009 | Mohammadi et al. |
| 2012/0086523 A1* | 4/2012 | Meltaus ............ H03H 3/02 333/187 |
| 2013/0214879 A1 | 8/2013 | Gorisse et al. |
| 2014/0225684 A1* | 8/2014 | Kando ............ H03H 9/02559 333/195 |
| 2014/0273881 A1 | 9/2014 | Tajic |
| 2018/0205362 A1* | 7/2018 | Kishimoto ............ H03H 9/145 |

OTHER PUBLICATIONS

Adachi et al., "Investigation of Spurious Modes of Convex DT-Cut Quartz Crystal Resonators," Proc. 35th Annual Freq Control Symposium, USERADCOM, Ft. Monmouth, NJ, May 1981, 8 pages.

Bahr et al., "Theory and Design of Phononic Crystals for Unreleased CMOS-MEMS Resonant Body Transistors," Journal of Microelectromechanical Systems, vol. 24, No. 5, Oct. 2015, 14 pages.

Bahr, "Monolithically Integrated MEMS Resonators and Oscillators in Standard IC Technology," Doctoral Thesis, Massachusetts Institute of Technology, May 18, 2016, 255 pages.

Bahr et al., "Vertical Acoustic Confinement for High-Q Fully-Differential CMOS-RBTS," Solid-State Sensors, Actuators and Microsystems Workshop, Hilton Head), 2016, 4 pages.

Bahr et al., "Optimization of Unreleased CMOS-MEMS RBTs," Frequency Control Symposium (IFCS), 2016 IEEE International, 4 pages.

Wang et al., "Tapered Phononic Crystal Saw Resonator in GAN," MEMS 2015, Estoril, Portugal, Jan. 18-22, 2015, IEEE, 4 pages.

Wang et al., "Resonant Body Transistors in Standard CMOS Technology," Oct. 2012, 7 pages.

Gorishnyy et al., "Sound ideas," Physics World, Dec. 2005, 6 pages.

Lin et al., "Quality Factor Enhancement in Lamb Wave Resonators Utilizing Aln Plates with Convex Edges," IEEE, Trasducers '11, Beijing, China, Jun. 5-9, 2011, 4 pages.

International Search Report for PCT/US2018/043612 dated Oct. 18, 2018.

\* cited by examiner

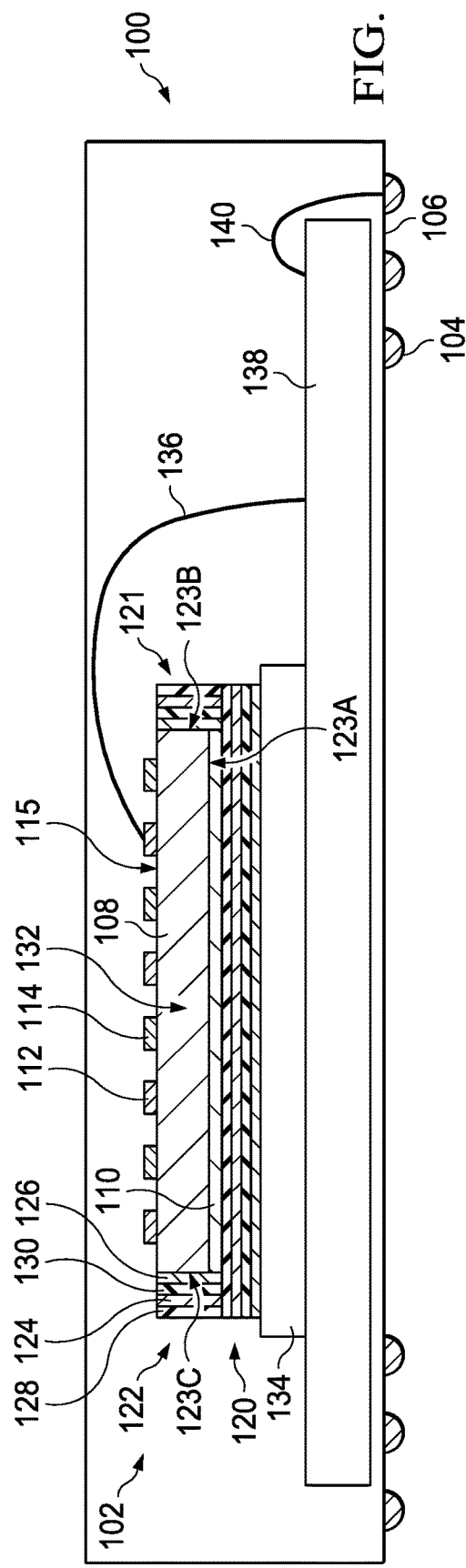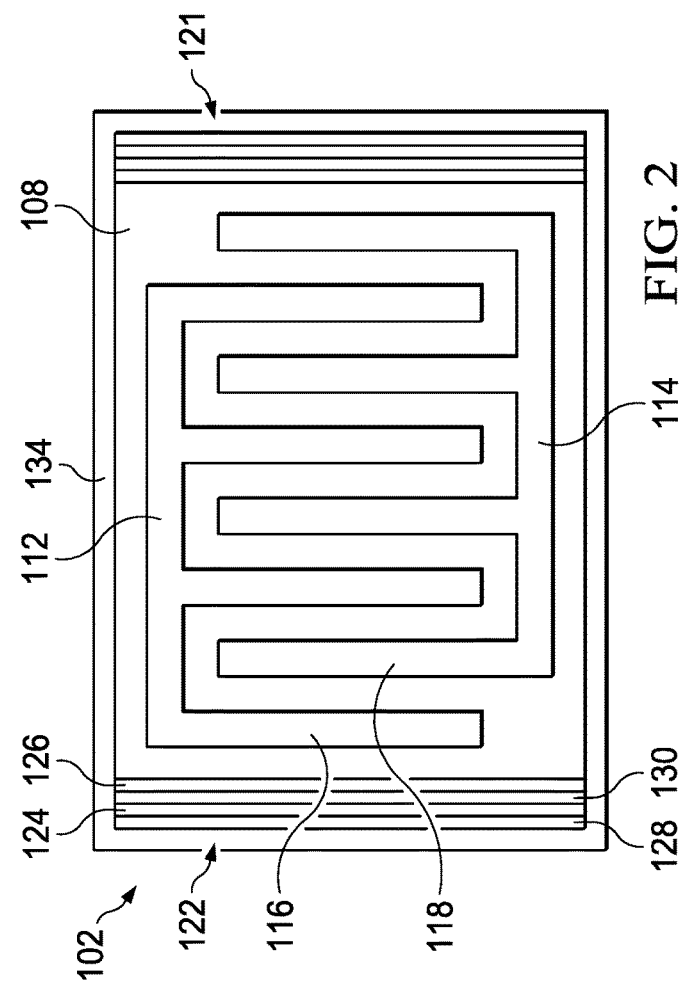

UNRELEASED PLANE ACOUSTIC WAVE RESONATORS

FIELD OF THE DISCLOSURE

This disclosure relates generally to plane acoustic wave (PAW) resonators, and, more particularly, to unreleased PAW resonators.

BACKGROUND

In PAW resonators, interdigitated electrodes (e.g., fingers, strip, etc.) on the surface of a piezoelectric layer provide voltage bias to excite acoustic waves through piezoelectric (and reverse piezoelectric) effect. Plane acoustic waves of specific frequencies are generated within the piezoelectric layer, forming an electrical resonance response.

SUMMARY

Unreleased PAW resonators are disclosed. An example unreleased PAW resonator includes a substrate, a first acoustic reflector disposed on the substrate, and a piezoelectric layer disposed on the first acoustic reflector, wherein the first acoustic reflector and the piezoelectric layer are unreleased from the substrate.

BRIEF DESCRIPTION OF THE DRAWINGS

FIG. 1 is a side cross-section view of an example integrated circuit (IC) package including an example unreleased PAW resonator, constructed according to this disclosure.

FIG. 2 is a top view of the example unreleased PAW resonator of FIG. 1.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Use of terms such as up, down, top, bottom, side, end, front, back, etc. herein are used with reference to a currently considered or illustrated orientation. If a different orientation is considered, such terms must be correspondingly modified. Connecting lines or connectors shown in the various figures presented are intended to represent example functional relationships and/or physical or logical couplings between the various elements.

DETAILED DESCRIPTION

The resonance frequency of bulk acoustic wave (BAW) resonators are determined, in part, by the thickness of their piezoelectric layer. In semiconductor implementations, piezoelectric layers are, by necessity, thin, which limits the range of frequencies implementable by BAW resonators. In contrast, the resonance frequencies of PAW resonators (a.k.a. contour mode resonators, or Lamb wave resonators) are determined, in part, by their lateral dimensions, for example, by the pitch of their interdigitated electrodes and the length and width of the piezoelectric layer. Accordingly, PAW resonators can implement a wider range of resonance frequencies than BAW resonators. However, known PAW resonators require the device to be released from (e.g., removed from, detached from, etc.) the substrate on which the PAW resonator is initially formed to confine acoustic energy in the PAW resonator, and then attached with tethers to other structures. Releasing a PAW resonator from a substrate can result in damage to the PAW resonator from mechanical stresses (e.g., vibration, shock, etc.). Moreover, released PAW resonator requires costly wafer-level packaging. The use of tethers may be unsuitable for high-power applications due to non-linear effects, and may cause high resistivity and heat dissipation issues.

Example unreleased PAW resonators that overcome at least these deficiencies of known PAW and BAW resonators are disclosed herein. The disclosed example unreleased PAW resonators include example acoustic reflectors (e.g., vertical and/or lateral) that confine acoustic energy in the unreleased PAW resonator, obviating the need to release the PAW resonator from the substrate on which it was formed. Thus, avoiding the disadvantages (e.g., mechanical stress, tethers, costly wafer-level packaging, limited heat dissipation, non-linearity, etc.) of known PAW resonators. In some disclosed examples, the unreleased PAW resonator is formed on a high-resistivity substrate that implements, among other things, a heat sink for the PAW resonator. In, for example, high power applications, the dissipation of heat improves the linearity of the PAW resonator.

In some examples, an unreleased PAW resonator, or variants thereof, means a PAW resonator that is intended to be, for all intents, formed (e.g., deposited, disposed, etc.) on a substrate to be permanently attached, coupled, connected, affixed, assembled or otherwise joined to the substrate in a way that is, by design, not intended for reversal. Even though an unreleased PAW resonator and substrate may be disassembled through, for example, sufficient knowledge, force, or tool does not negate the fact that they were intended, by design, to be fixedly assembled at manufacture of the unreleased PAW resonator. In stark contrast, released PAW resonators are, during manufacture, formed on a substrate, and then released (e.g., removed, detached, etc.) from the substrate.

Reference will now be made in detail to non-limiting examples of this disclosure, examples of which are illustrated in the accompanying drawings. The examples are described below by referring to the drawings.

FIG. 1 is a side cross-section view of an example IC package 100 having an example unreleased PAW resonator 102 disposed in the example IC package 100. FIG. 2 is a top view of the example PAW resonator 102 of FIG. 1. The example IC package 100 of FIG. 1 is a surface mount device with a plurality of contacts (an example of which is designated at reference numeral 104) on a bottom side 106. However, the example IC package 100 may be of any type, and may have any form, material(s), shape, dimension(s), number of contacts, shape of contacts, etc. Moreover, the unreleased PAW resonator 102 and/or any other components may be packaged, mounted, etc. in the IC package 100 in any way. The example IC package 100 may be, for example, a semiconductor-based device. In some examples, the IC package 100 is a wafer-level package, or a die-level package.

The example unreleased PAW resonator 102 of FIGS. 1 and 2 includes a piezoelectric layer 108 formed (e.g., deposited, disposed, etc.) on an example grounded electrode 110. In the case of a semiconductor-based IC package, the example piezoelectric layer 108 may include a piezoelectric material compatible with a semiconductor (e.g., complementary metal-oxide-semiconductor (CMOS)) manufacturing process, such as aluminum nitride (AlN), zinc oxide (ZnO), etc.

To excite acoustic waves in the unreleased PAW resonator 102, the example unreleased PAW resonator 102 of FIGS. 1 and 2 includes a first electrode 112 and a second electrode 114 on a top surface 115 of the piezoelectric layer 108. As shown in FIG. 2, the first electrode 112 includes a plurality of example fingers, one of which is designated at reference numeral 116, and the second electrode 114 includes a plurality of example fingers, one of which is designated at reference numeral 118. In the example of FIG. 2, the fingers 116 are interlaced with the fingers 118. Other electrodes having other configurations may be used. In the case of a semiconductor-based IC package, the example electrodes 110, 112 and 114 are formed of a conductive material compatible with a semiconductor manufacturing process.

To increase retention of acoustic energy in the unreleased PAW resonator 102, the example unreleased PAW resonator 102 includes an example horizontal (in the illustrated orientation of FIG. 1) acoustic reflector 120, and example vertical (in the illustrated orientation of FIG. 1) acoustic reflectors 121 and 122. Acoustic reflectors 120-122 are also known as dielectric mirrors, Bragg mirrors, etc. The example acoustic reflector 120 of FIG. 1 reduces acoustic energy leakage vertically through a bottom surface 123A of the piezoelectric layer 108. The example acoustic reflector 121 of FIGS. 1 and 2 reduces acoustic energy leakage laterally through the right end or edge 123B of the piezoelectric layer 108. The example acoustic reflector 122 of FIGS. 1 and 2 reduces acoustic energy leakage laterally through the left end or edge 123C of the piezoelectric layer 108.

Any known or future Bragg mirror, dielectric mirror, acoustic reflector, etc. may be used to implement the acoustic reflectors 120-122. The example acoustic reflectors 120-122 of FIGS. 1 and 2 include alternating layers of materials with different refractive indices. In some examples, the acoustic reflectors 120-122 include alternating flat conductive members (e.g., layers, sheets, plates, etc. of metal), two of which are designated at reference numerals 124 and 126, and flat dielectric members (e.g., layers, sheets, plates, etc. of a dielectric material), two of which are designated at reference numerals 128 and 130. The thickness(es) of and distances between the conductive members 124 and 126 are selected, based on an intended resonance frequency of the unreleased PAW resonator 102, to cause constructive interference at that frequency, resulting in the acoustic reflectors 120-122 reducing spurious modes, and confining (e.g., reflecting, directing, containing, etc.) at least some main mode of acoustic energy at that frequency in a resonant cavity portion 132 of the unreleased PAW resonator 102. In some examples, confining main mode acoustic energy refers to confining a portion of the main mode of acoustic energy. Thus, retention of acoustic energy at the intended resonance frequency in the unreleased PAW resonator 102 is increased, and the quality factor (Q) of the unreleased PAW resonator 102 is increased, and, in turn, the performance of a system including the example unreleased PAW resonator 102 and/or the example IC package 100. In some examples, the conductive members 124 and 126 include tungsten (W), titanium tungsten (TiW), or copper (Cu), and the dielectric members 128 and 130 includes silicon dioxide ($SiO_2$), or a carbon doped oxide dielectric such as SiCOH, or aluminum nitride (AlN). In some examples, one or more of the acoustic reflectors 120-122 are implemented using a two-dimensional (2D) or a three-dimensional phononic crystal.

As shown in FIG. 1, the example acoustic reflector 120 is formed on example substrate 134 (e.g., a carrier wafer, etc.), forming the PAW resonator 102 as an unreleased PAW resonator 102. As shown in FIGS. 1 and 2, the acoustic reflectors 121 and 122 are disposed on the substrate 134 adjacent respective right and left (e.g., lateral) edges of the piezoelectric layer 108. Thus, the acoustic reflector 120 confines acoustic energy in the up-down direction, and the acoustic reflectors 121 and 122 confine acoustic energy in the lateral (e.g., right-left) directions. In some examples, the acoustic reflectors 121 and 122 can be omitted and use the air cavity as the lateral reflector. This configuration is also an unreleased PAW resonator since the resonator 102 is still attached on the vertical acoustic reflector 120 and the substrate 134. In some examples, the substrate 134 is formed of a high resistivity material, and the substrate 134 implements a heat sink for the unreleased PAW resonator 102, thus, improving the linearity of the unreleased PAW resonator 102 in, for example, high power applications.

The example electrodes 112 and 114 of FIGS. 1 and 2 may be electrically coupled with other components in the IC package 100 and/or external components. For example, the electrode 112 and/or the electrode 114 may be electrically coupled (shown conceptually by an example bone wire 136) to an IC 138 (e.g., a digital logic circuit, an analog circuit, a processor core, a digital signal processor (DSP) core, etc.) implemented in the IC package 100. In some examples, the IC 138 controls and/or uses a clock signal generated using the unreleased PAW resonator 102 to perform one or more functions (e.g., down conversion, up conversion, modulation, de-modulation, etc.). In some examples, the unreleased PAW resonator 102 is coupled with other acoustic resonators of different sizes to form a filtering function. The IC 138 and/or one of the electrodes 112 and 114 may be electrically coupled to the external contact 104, as shown in FIG. 1 with a bond wire 140. In some examples, the IC 138 is an IC die, and the unreleased PAW resonator 102 is a microelectromechanical system (MEMS) die.

The example acoustic reflectors 120-122 of FIGS. 1 and 2 may be formed using any number and/or type(s) of steps, processes, methods, etc. In some examples, the acoustic reflectors 120-122 are formed using conformal deposition to form alternating layers of metal and dielectric materials. In some examples, the acoustic reflectors 121 and 122 are formed by encompassing the piezoelectric layer 108 in a dielectric material, forming vertical trenches in the dielectric material to receive conductive material, filling the trenches with the conductive material, and then using chemical and mechanical polishing to remove excess conductive and dielectric materials.

While an example manner of implementing the IC package 100 including an unreleased PAW resonator 102, in accordance with this disclosure, is illustrated in FIGS. 1 and 2, one or more of the parts illustrated in FIGS. 1 and 2 may be combined, divided, re-arranged, omitted, eliminated and/or implemented in any other way. Further, an IC package including an unreleased PAW resonator having a convex surface in accordance with this disclosure may include one or more parts in addition to, and/or instead of, those illustrated in FIGS. 1 and 2, and/or may include more than one of any or all the illustrated parts. For example, acoustic reflectors may be included.

"Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended. Conjunctions such as "and," "or," and "and/or" are inclusive unless the context clearly dictates otherwise. For example, "A and/or B" includes A alone, B alone, and A with B. In this specification and the appended claims, the singular forms "a," "an" and "the" do not exclude the plural reference unless the context clearly dictates otherwise.

Any references, including publications, patent applications, and patents, cited herein are hereby incorporated by reference to the same extent as if each reference were individually and specifically indicated to be incorporated by reference and were set forth in its entirety herein.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An unreleased plane acoustic wave (PAW) resonator, comprising:
   a substrate;
   a first acoustic reflector on the substrate;
   a piezoelectric layer on the first acoustic reflector, the first acoustic reflector and the piezoelectric layer being unreleased from the substrate; and
   a second acoustic reflector adjacent an edge of the piezoelectric layer.

2. The unreleased PAW resonator of claim 1, wherein the edge is a first edge, the piezoelectric layer has a second edge opposite the first edge, the piezoelectric layer has opposite first and second surfaces, the first acoustic reflector faces the first surface, the second acoustic reflector faces the first edge, and the unreleased PAW resonator further comprises a third acoustic reflector facing the second edge.

3. The unreleased PAW resonator of claim 2, further comprising:
   a first electrode having first fingers on the second surface; and
   a second electrode having second fingers on the second surface, the first fingers interdigitated with the second fingers.

4. The unreleased PAW resonator of claim 2, wherein:
   the first acoustic reflector is configured to confine acoustic energy in a first direction;
   the second acoustic reflector is configured to confine acoustic energy in a second direction perpendicular to the first direction; and
   the third acoustic reflector is configured to confine acoustic energy in a third direction opposite the second direction.

5. The unreleased PAW resonator of claim 1, wherein the second acoustic reflector includes alternating layers of a first material and a second material, the first material and the second material having different refractive indices.

6. The unreleased PAW resonator of claim 1, wherein the second acoustic reflector includes a phononic crystal.

7. The unreleased PAW resonator of claim 1, wherein the piezoelectric layer includes at least one of aluminum nitride or zinc oxide.

8. An integrated circuit (IC) package comprising:
   an unreleased plane acoustic wave (PAW) resonator including:
   a substrate;
   a first acoustic reflector unreleasably on the substrate;
   a piezoelectric layer on the first acoustic reflector; and
   a second acoustic reflector adjacent an edge of the piezoelectric layer.

9. The IC package of claim 8, wherein the edge is a first edge, the piezoelectric layer has a second edge opposite the first edge, the piezoelectric layer has opposite first and second surfaces, the first acoustic reflector faces the first surface, the second acoustic reflector faces the first edge, and the IC package further comprises a third acoustic reflector facing the second edge.

10. The IC package of claim 9, wherein:
    the first acoustic reflector is configured to confine acoustic energy in a first direction;
    the second acoustic reflector is configured to confine acoustic energy in a second direction perpendicular to the first direction; and
    the third acoustic reflector is configured to confine acoustic energy in a third direction opposite the second direction.

11. The IC package of claim 9, wherein the unreleased PAW resonator includes:
    a first electrode having first fingers on the second surface; and
    a second electrode having second fingers on the second surface, the first fingers interlaced with the second fingers.

12. The IC package of claim 8, wherein the second acoustic reflector includes alternating layers of a first material and a second material, the first material and the second material having different refractive indices.

13. The IC package of claim 8, wherein the second acoustic reflector includes a phononic crystal.

14. An unreleased plane acoustic wave (PAW) resonator, comprising:
    a substrate;
    a first acoustic reflector on the substrate;
    a piezoelectric layer on the first acoustic reflector, the piezoelectric layer having opposite first and second surfaces and opposite first and second edges, and the first acoustic reflector facing the first surface;
    a second acoustic reflector adjacent the first edge and facing the first edge;
    a third acoustic reflector adjacent the second edge and facing the second edge;
    a first electrode having first fingers on the second surface; and
    a second electrode having second fingers on the second surface, the first fingers interlaced with the second fingers.

15. The unreleased PAW resonator of claim 14, wherein:
    the first acoustic reflector is configured to confine acoustic energy in a first direction;
    the second acoustic reflector is configured to confine acoustic energy in a second direction perpendicular to the first direction; and
    the third acoustic reflector is configured to confine acoustic energy in a third direction opposite the second direction.

16. The unreleased PAW resonator of claim 14, wherein the second acoustic reflector includes alternating layers of a first material and a second material, the first material and the second material having different refractive indices.

17. The unreleased PAW resonator of claim 14, wherein the second acoustic reflector includes a phononic crystal.

* * * * *